United States Patent
Oishi et al.

(10) Patent No.: US 10,851,261 B2
(45) Date of Patent: Dec. 1, 2020

(54) SEMICONDUCTOR-ENCAPSULATING EPOXY RESIN COMPOSITION AND SEMICONDUCTOR DEVICE

(71) Applicant: SHIN-ETSU CHEMICAL CO., LTD., Tokyo (JP)

(72) Inventors: Hiroki Oishi, Annaka (JP); Shoichi Osada, Annaka (JP); Ryuhei Yokota, Annaka (JP); Munenao Hirokami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 74 days.

(21) Appl. No.: 16/377,930

(22) Filed: Apr. 8, 2019

(65) Prior Publication Data

US 2019/0309184 A1 Oct. 10, 2019

(30) Foreign Application Priority Data

Apr. 9, 2018 (JP) ................................. 2018-074419

(51) Int. Cl.
| | | |
|---|---|---|
| *C08G 59/62* | (2006.01) | |
| *H01L 23/29* | (2006.01) | |
| *C08L 63/00* | (2006.01) | |
| *C09J 163/00* | (2006.01) | |
| *C09D 163/04* | (2006.01) | |
| *C08G 59/32* | (2006.01) | |
| *C08G 59/24* | (2006.01) | |
| *C08K 5/544* | (2006.01) | |
| *C09D 163/00* | (2006.01) | |
| *C09D 7/63* | (2018.01) | |
| *C08K 5/3475* | (2006.01) | |

(52) U.S. Cl.
CPC .......... *C09D 163/04* (2013.01); *C08G 59/245* (2013.01); *C08G 59/3218* (2013.01); *C08G 59/621* (2013.01); *C08K 5/3475* (2013.01); *C08K 5/544* (2013.01); *C09D 7/63* (2018.01); *C09D 163/00* (2013.01); *H01L 23/293* (2013.01); *C08K 2201/014* (2013.01)

(58) Field of Classification Search
None
See application file for complete search history.

(56) References Cited

U.S. PATENT DOCUMENTS

| 5,980,851 A | * | 11/1999 | Suga | .................. G02F 1/133509 |
| | | | | 423/412 |
| 2010/0193961 A1 | * | 8/2010 | Konishi | .................. C09J 163/00 |
| | | | | 257/773 |
| 2010/0247922 A1 | * | 9/2010 | Shah | .................... C09D 163/00 |
| | | | | 428/418 |
| 2013/0109785 A1 | * | 5/2013 | Endo | ....................... H05K 3/287 |
| | | | | 523/436 |

FOREIGN PATENT DOCUMENTS

| JP | 2001-65339 A | 3/2001 |
| JP | 2004-137397 A | 5/2004 |

* cited by examiner

*Primary Examiner* — Michael J Feely
(74) *Attorney, Agent, or Firm* — Birch, Stewart, Kolasch & Birch, LLP

(57) ABSTRACT

An epoxy resin composition comprising an epoxy resin, a curing agent, (A) a carboxyl-containing benzotriazole derivative, and (B) an alkoxysilyl-containing aminoalkylsilane derivative is suited for encapsulating semiconductor devices. The sum of (A)+(B) is 0.5-5.0 pbw per 100 pbw of the sum of the epoxy resin and the curing agent, and a molar ratio (A)/(B) is 0.5-1.5. The composition is free of sulfur and highly adhesive to metal substrates.

6 Claims, No Drawings

SEMICONDUCTOR-ENCAPSULATING EPOXY RESIN COMPOSITION AND SEMICONDUCTOR DEVICE

CROSS-REFERENCE TO RELATED APPLICATION

This non-provisional application claims priority under 35 U.S.C. § 119(a) on Patent Application No. 2018-074419 filed in Japan on Apr. 9, 2018, the entire contents of which are hereby incorporated by reference.

TECHNICAL FIELD

This invention relates to a semiconductor-encapsulating epoxy resin composition and a semiconductor device encapsulated with a cured product of the resin composition.

BACKGROUND ART

The current mainstream of semiconductor devices including diodes, transistors, ICs, and LSIs is of the resin encapsulation type. Epoxy resins have superior moldability, adhesion, electrical properties, mechanical properties, and moisture resistance to other thermosetting resins. Epoxy resin compositions are commonly used to encapsulate semiconductor devices. Over the decade, the electronic equipment market is under the increasing trend toward compact size, light weight and high performance of semiconductor devices and high integration of semiconductor chips. As the semiconductor device packaging technology is continuously innovated, severer requirements are imposed on the epoxy resins serving as semiconductor encapsulant. As semiconductor devices target higher performance and integration, semiconductor chips tend to release more heat. While the semiconductor device as a whole is structured for effective heat dissipation, the encapsulating resin itself must be heat resistant. Since the semiconductor devices for automobile and pressure applications are often exposed to a high-temperature environment around the engine or the like, the encapsulating resin must be not only heat resistant, but also reliable.

While semiconductor chips target higher performance, it is required to reduce the cost of semiconductor devices. Attempts are made to replace wires or interconnections of expensive gold, which are commonly used in the prior art, by cheap wires or interconnections of copper, copper alloy, silver alloy, aluminum and the like.

Also, the packaging temperature is elevated as a result of the switchover to lead-free solder. If semiconductor devices are moistened, the elevated temperature cause troubles, for example, cracking of packages during mounting, and interfacial separation between the encapsulant and metal frames, organic substrates or semiconductor chips. Therefore, encapsulating resin compositions are required to be tightly adhesive to metal frames, organic substrates or semiconductor chips.

Among means for improving the adhesion of resins to metals such as copper and silver, one common technique is to add a sulfur-containing tackifier such as 3-mercaptopropylsilane. Also, Patent Document 1 proposes the use of a phenolic resin having a thiophene structure, and Patent Document 2 discloses a phenolic disulfide compound. Since these techniques use sulfur-containing compounds, there is the risk of metals being corroded because organic components are decomposed to generate sulfide or sulfate ions under high-temperature conditions.

CITATION LIST

Patent Document 1: JP-A 2001-065339
Patent Document 2: JP-A 2004-137397

SUMMARY OF INVENTION

An object of the invention is to provide a semiconductor-encapsulating epoxy resin composition which is sulfur-free and tightly adhesive to metal substrates, especially copper substrates, and a semiconductor device encapsulated with a cured product of the composition.

The inventors have found that when (A) a benzotriazole derivative having at least one carboxyl group per molecule and (B) an aminoalkylsilane derivative having at least one alkoxysilyl group per molecule are added to an epoxy resin composition comprising an epoxy resin and a curing agent as essential components, in such amounts that the sum of (A) and (B) falls in a specific range relative to the sum of the epoxy resin and the curing agent, and a molar ratio (A)/(B) falls in a specific range, the resulting epoxy resin composition is tightly adhesive to metal substrates, especially copper substrates, without a need for sulfur components.

In one aspect, the invention provides an epoxy resin composition for semiconductor encapsulation comprising an epoxy resin and a curing agent as essential components, the composition further comprising (A) a benzotriazole derivative having at least one carboxyl group per molecule and (B) an aminoalkylsilane derivative having at least one alkoxysilyl group per molecule in such amounts that the sum of (A) and (B) is 0.5 to 5.0 parts by weight per 100 parts by weight of the sum of the epoxy resin and the curing agent, and a molar ratio (A)/(B) ranges from 0.5/1 to 1.5/1.

Typically, the curing agent is a phenolic curing agent.

In one preferred embodiment, components (A) and (B) are present as a premix which is obtained by reacting components (A) and (B) in a molar ratio (A)/(B) of 0.5/1 to 1.5/1.

Preferably, component (A) is a compound having the formula (1):

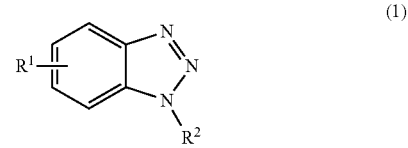

(1)

wherein $R^1$ is a $C_1$-$C_{10}$ straight alkyl group terminated with carboxyl or a $C_7$-$C_{20}$ aromatic hydrocarbon group terminated with carboxyl, and $R^2$ is hydrogen, a $C_1$-$C_{10}$ alkyl group, $C_1$-$C_{10}$ hydroxyl-containing hydrocarbon group, or $C_1$-$C_{10}$ hydrocarbon group terminated with carboxyl.

Preferably, component (B) is a compound having the formula (2):

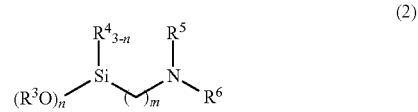

(2)

wherein $R^3$ is a $C_1$-$C_6$ alkyl group, $R^4$ is a $C_1$-$C_6$ alkyl group or $C_6$-$C_{10}$ aromatic hydrocarbon group, $R^5$ and $R^6$ are each independently hydrogen, $C_1$-$C_6$ alkyl group, $C_1$-$C_6$ amino-containing alkyl group, or $C_6$-$C_{10}$ aromatic hydrocarbon group, n is an integer of 1 to 3, and m is an integer of 1 to 6.

Also contemplated herein is a semiconductor device encapsulated with a cured product of the epoxy resin composition.

ADVANTAGEOUS EFFECTS OF INVENTION

The epoxy resin composition of the invention cures into a product which is tightly bondable to metals, especially copper, without a need for sulfur components. The composition is advantageously used as an encapsulant for semiconductor devices including copper substrates, copper wires, copper heatsinks and the like.

DESCRIPTION OF PREFERRED EMBODIMENTS

The notation (Cn-Cm) means a group containing from n to m carbon atoms per group.

Epoxy Resin Composition

One embodiment of the invention is an epoxy resin composition adapted for semiconductor encapsulation, comprising an epoxy resin and a curing agent as essential components. To the composition, (A) a benzotriazole derivative having at least one carboxyl group per molecule and (B) an aminoalkylsilane derivative having at least one alkoxysilyl group per molecule are added in such amounts that the sum of (A) and (B) is 0.5 to 5.0 parts by weight per 100 parts by weight of the sum of the epoxy resin and the curing agent, and a molar ratio (A)/(B) ranges from 0.5/1 to 1.5/1.

Epoxy Resin

The epoxy resin is a base polymer in the inventive composition. Included are monomers, oligomers and polymers having at least two epoxy groups per molecule. The epoxy resin is not limited in molecular weight and molecular structure. Examples include novolak type epoxy resins such as phenol novolak type epoxy resins, cresol novolak type epoxy resins, and naphthol novolak type epoxy resins; crystalline epoxy resins such as biphenyl type epoxy resins, bisphenol type epoxy resins, stilbene type epoxy resins, dihydroanthracene diol type epoxy resins; polyfunctional epoxy resins such as triphenolmethane type epoxy resins and alkyl-modified triphenolmethane type epoxy resins; aralkyl type epoxy resins such as phenol aralkyl type epoxy resins having phenylene skeleton, phenol aralkyl type epoxy resins having biphenylene skeleton, naphthol aralkyl type epoxy resins having phenylene skeleton, and naphthol aralkyl type epoxy resins having biphenylene skeleton; naphthol type epoxy resins such as dihydroxynaphthalene type epoxy resins and epoxy resins obtained by converting a dimer of dihydroxynaphthalene to glycidyl ether form; triazine nucleus-containing epoxy resins such as triglycidyl isocyanurate and monoallyl diglycidyl isocyanurate; cyclic hydrocarbon-modified phenol type epoxy resins such as dicyclopentadiene-modified phenol type epoxy resins. These resins may be used alone or in admixture.

Curing Agent

The other essential component is a curing agent which is typically a phenolic resin. Included are monomers, oligomers and polymers having at least two phenolic hydroxyl groups per molecule. The phenolic resin is not limited in molecular weight and molecular structure. Examples include phenol novolak resins, phenol novolak type phenolic resins, naphthalene ring-containing phenolic resins, aralkyl type phenolic resins, triphenol alkane type phenolic resins, biphenyl type phenolic resins, biphenyl aralkyl type phenolic resins, alicyclic phenolic resins, heterocyclic phenolic resins, naphthalene ring-containing phenolic resins, and bisphenol type phenolic resins such as bisphenol A resins and bisphenol F resins. These resins may be used alone or in admixture.

In the disclosure, the epoxy resin and curing agent (phenolic curing agent) combined is sometimes referred to as "thermosetting resin component." It is assumed that the amount of the thermosetting resin component is 100 parts by weight, which is used as a basis for formulation of other components. In the thermosetting resin component, 100 parts by weight of the epoxy resin is combined with 20 to 400 parts by weight, preferably 60 to 140 parts by weight of the curing agent.

Component (A)

Component (A) is a benzotriazole derivative having at least one carboxyl group in the molecular structure. A benzotriazole derivative having the formula (1) is preferred.

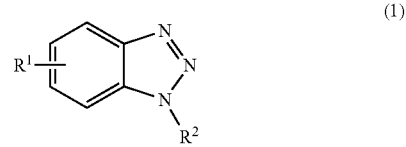

Herein $R^1$ is a $C_1$-$C_{10}$, preferably $C_1$-$C_6$ straight alkyl group terminated with carboxyl or a $C_7$-$C_{20}$, preferably $C_7$-$C_{10}$ aromatic hydrocarbon group terminated with carboxyl. Examples of $R^1$ include carboxymethyl, 2-carboxyethyl, 3-carboxypropyl, 4-carboxybutyl, o-carboxyphenyl, m-carboxyphenyl, p-carboxyphenyl, o-carboxybenzyl, m-carboxybenzyl, and p-carboxybenzyl.

$R^2$ is hydrogen, a $C_1$-$C_{10}$, preferably $C_1$-$C_6$ alkyl group, a $C_1$-$C_{10}$, preferably $C_1$-$C_6$ hydroxyl-containing hydrocarbon group, or a $C_1$-$C_{10}$, preferably $C_1$-$C_6$ hydrocarbon group terminated with carboxyl. Examples of $R^2$ include hydrogen, alkyl groups such as methyl, ethyl, propyl, isopropyl, n-butyl, isobutyl, t-butyl, pentyl, and hexyl, hydroxyl-containing hydrocarbon groups such as hydroxymethyl, 2-hydroxyethyl, 3-hydroxypropyl, and 4-hydroxybutyl, and carboxyl-terminated hydrocarbon groups such as carboxymethyl, 2-carboxyethyl, 3-carboxypropyl and 4-carboxybutyl.

Examples of the benzotriazole derivative having formula (1) include 4-carboxybenzotriazole, 5-carboxybenzotriazole, mixtures thereof, and hydrates thereof.

Component (A) is used in an amount of 0.15 to 4.0 parts, preferably 0.2 to 3.0 parts by weight per 100 parts by weight of the thermosetting resin component (i.e., epoxy resin+curing agent).

Component (B)

Component (B) is an aminoalkylsilane derivative having at least one alkoxysilyl group per molecule. An aminoalkylsilane having the formula (2) and/or a hydrolysate thereof is preferred.

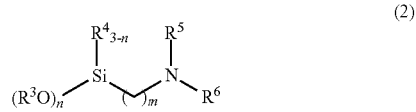

Herein $R^3$ is a $C_1$-$C_6$, preferably $C_1$-$C_4$ alkyl group. Examples include methyl, ethyl, propyl, isopropyl and n-butyl.

$R^4$ is a $C_1$-$C_6$, preferably $C_1$-$C_4$ alkyl group or a $C_6$-$C_{10}$, preferably $C_6$-$C_8$ aromatic hydrocarbon group. Suitable alkyl groups include methyl, ethyl, propyl, isopropyl and n-butyl. Suitable aryl groups include phenyl, benzyl and tolyl.

$R^5$ and $R^6$ are each independently selected from hydrogen, $C_1$-$C_6$, preferably $C_1$-$C_4$ alkyl groups, $C_1$-$C_6$ amino-containing alkyl groups, and $C_6$-$C_{10}$ aromatic hydrocarbon groups. Examples include hydrogen, alkyl groups such as methyl, ethyl, propyl, isopropyl and n-butyl, amino-containing alkyl groups such as aminomethyl, 2-aminoethyl, 3-aminopropyl, and aromatic hydrocarbon groups such as phenyl, benzyl and tolyl.

The subscript n is an integer of 1 to 3, preferably 2 or 3, and m is an integer of 1 to 6, preferably 1, 2 or 3.

Examples of the aminoalkylsilane having formula (2) include trialkoxysilanes such as N-(β-aminoethyl)-γ-aminopropyltrimethoxysilane, γ-aminopropyltriethoxysilane, γ-aminopropyltrimethoxysilane, N-phenyl-γ-aminopropyltrimethoxysilane; and dialkoxysilanes such as N-(β-aminoethyl)-γ-aminopropyldimethoxymetylsilane, γ-aminopropyldiethoxymethylsilane, γ-aminopropyldimethoxymethylsilane, N-phenyl-γ-aminopropyldimethoxymethylsilane. Besides the aminoalkylsilanes having formula (2), amino-containing bissilanes such as bis(γ-trimethoxysilylpropyl)-N-methylamine and bis(γ-dimethoxymethylsilylpropyl)-N-phenylamine may also be used. Partial hydrolysates of the foregoing compounds, co-hydrolysates of two or more of the foregoing compounds, and mixtures of any two or more are also useful. Inter alia, those compounds having primary amine are desirable from the standpoint of reactivity, with γ-aminopropyltrimethoxysilane being most preferred.

Component (B) is used in an amount of 0.25 to 5.0 parts, preferably 0.3 to 4.0 parts by weight per 100 parts by weight of the thermosetting resin component (i.e., epoxy resin+ curing agent).

In the epoxy resin composition, the benzotriazole derivative (A) and the aminoalkylsilane derivative (B) are present in such amounts as to give a molar ratio (A)/(B) of from 0.5/1 to 1.5/1, preferably 0.7/1 to 1.2/1.

In another embodiment, components (A) and (B) may be present in the epoxy resin composition as a premix obtained by reacting the benzotriazole derivative (A) and the aminoalkylsilane derivative (B) in a molar ratio (A)/(B) of from 0.5 to 1.5, preferably 0.7 to 1.2.

If the molar ratio (A)/(B) is less than 0.5, the benzotriazole derivative (A) is difficultly dispersed in the resin. If the molar ratio (A)/(B) is more than 1.5, the resin viscosity may increase due to the basicity of amino groups.

The benzotriazole derivative (A) and the aminoalkylsilane derivative (B) are blended in such amounts that the sum of components (A) and (B) or the amount of the premix is 0.5 to 5.0 parts, preferably 0.7 to 3.0 parts, more preferably 1.0 to 2.0 parts by weight per 100 parts by weight of the thermosetting resin component (i.e., epoxy resin+curing agent). If the sum of components (A) and (B) is less than 0.5 part by weight, adhesion may be poor. If the sum of components (A) and (B) exceeds 5.0 parts by weight, pyrolysis resistance may be poor.

Other Components

The epoxy resin composition may further contain a tackifier which is selected from well-known ones. For example, silane coupling agents and titanate coupling agents are suitable. Examples include epoxysilanes such as γ-glycidoxypropyltrimethoxysilane, γ-glycidoxypropylmethyldiethoxysilane, β-(3,4-epoxycyclohexyl)ethyltrimethoxysilane; and titanate coupling agents such as isopropyltriisostearoyl titanate, bis(dioctylpyrophosphate) oxyacetate titanate. Inter alia, epoxysilane coupling agents such as γ-glycidoxypropyltrimethoxysilane and γ-glycidoxypropylmethyldiethoxysilane are preferred.

The amount of the tackifier used is typically 0.25 to 2.5 parts, preferably 0.35 to 1.5 parts, more preferably 0.5 to 1.0 part by weight per 100 parts by weight of the thermosetting resin component. If the amount of the tackifier is less than 0.25 part, adhesion may be poor. If the amount of the tackifier exceeds 2.5 parts, pyrolysis resistance may be poor. It is noted that when the benzotriazole derivative (A) and the aminoalkylsilane derivative (B) or the premix thereof is used in combination with the tackifier, the sum of the total amount of components (A) and (B) or the amount of the premix and the amount of the tackifier is typically 0.5 to 5.0 parts, preferably 0.7 to 3.0 parts, more preferably 1.0 to 2.0 parts by weight per 100 parts by weight of the thermosetting resin component. The amount of the tackifier is preferably equal to or less than half of the total amount of components (A) and (B).

The epoxy resin composition may further contain other additives as long as the benefits of the invention are not impaired. Suitable other additives include cyanate resins other than the epoxy resin and phenolic resin, thermosetting resins such as maleimide resins, cure promoters, inorganic fillers, parting agents, flame retardants, ion trapping agents, pigments and flexibilizers.

Suitable cyanate resins are not particularly limited as long as the molecular structure has at least two cyanate groups. Any commercially available cyanate resins may be used. Examples include bis(4-cyanatophenyl)methane, bis(3-methyl-4-cyanatophenyl)methane, bis(3-ethyl-4-cyanatophenyl)methane, bis(3,5-dimethyl-4-cyanatophenyl)methane, 1,1-bis(4-cyanatophenyl)ethane, 2,2-bis(4-cyanatophenyl)propane, 2,2-bis(4-cyanatophenyl)-1,1,1,3,3,3-hexafluoropropane, di(4-cyanatophenyl)thioether, 1,3- or 1,4-dicyanatobenzene, 2-tert-butyl-1,4-dicyanatobenzene, 2,4-dimethyl-1,3-dicyanatobenzene, 2,5-di-tert-butyl-1,4-dicyanatobenzene, tetramethyl-1,4-dicyanatobenzene, 1,3,5-tricyanatobenzene, 2,2'- or 4,4'-dicyanatobiphenyl, 3,3',5,5'-tetramethyl-4,4'-dicyanatobiphenyl, 1,3-, 1,4-, 1,5-, 1,6-, 1,8-, 2,6- or 2,7-dicyanatonaphthalene, 1,3,6-tricyanatonaphthalene, bis(4-cyanatophenyl)methane; 2,2-bis(4-cyanatophenyl)propane, 1,1,1-tris(4-cyanatophenyl)ethane, bis(4-cyanatophenyl) ether, 4,4'-(1,3-phenylenediisopropylidene)diphenyl cyanate, bis(4-cyanatophenyl)thioether, bis(4-cyanatophenyl)sulfone, tris(4-cyanatophenyl)phosphine, tris(4-cyanatophenyl)phosphate, phenol novolak type cyanate, cresol novolak type cyanate, dicyclopentadiene novolak type cyanate, phenylaralkyl type cyanate esters, biphenyl aralkyl type cyanate esters, and naphthalene aralkyl type cyanate esters. These cyanate esters may be used alone or in admixture.

Suitable maleimide resins are not particularly limited as long as the molecular structure has at least two maleimide groups. Any commercially available maleimide resins may be used. Examples include difunctional bismaleimides such as 4,4'-diphenylmethane bismaleimide, m-phenylene bismaleimide, bisphenol A diphenyl ether bismaleimide, 3,3-dimethyl-5,5-diphenylmethane bismaleimide, 4-methyl-1,3-phenylene bismaleimide, 1,6-bismaleimide-(2,2,4-trimethyl)hexane; and polyfunctional maleimides such as phenylmethane maleimide. Inter alia, 4,4'-diphenylmethane bismaleimide having a melting point of up to 175° C. is desirable from the standpoint of dissolution.

Any well-known cure promoters capable of facilitating the cure of epoxy resins and cyanate resins may be used. Suitable cure promoters include tertiary amine compounds, quaternary ammonium salts, imidazoles, urea compounds, phosphine compounds, and phosphonium salts. Examples include tertiary amine compounds such as triethylamine, triethylenediamine, benzyldimethylamine, 2,4,6-tris(dimethylaminomethyl)phenol, 1,8-diazabicyclo(5,4,0)undecene-7; imidazoles such as 2-methylimidazole, 2,4-dimethylimidazole, 2-ethyl-4-methylimidazole, 2-phenylimidazole, 2-phenyl-4-methylimidazole; urea compounds such as 3-phenyl-1,1-dimethylurea, 3-(o-methylphenyl)-1,1-dimethylurea, 3-(p-methylphenyl)-1,1-dimethylurea, 1,1'-phenylenebis(3,3-dimethylurea), 1,1'-(4-methyl-m-phenylene)-bis(3,3-dimethylurea); phosphine compounds such as triphenylphosphine, tributylphosphine, tri(p-methylphenyl)phosphine, tri(nonylphenyl)phosphine; and phosphonium salts such as triphenylphosphonium phenolates, e.g., 4-hydroxy-2-(triphenylphosphonium) phenolate, tetraphenylphosphonium tetraphenylborate and tetraphenylphosphonium tetranaphthoic acid borate, and microcapsule forms thereof. They may be used alone or in admixture. The amount of the cure promoter used is preferably 0.5 to 5.0 parts, more preferably 1.0 to 3.0 parts by weight per 100 parts by weight of the thermosetting resin component although the amount of cure promoter varies depending on a particular resin with which it is combined. If the amount of cure promoter is less than 0.5 part, the composition may be under-cured. If the amount of cure promoter exceeds 5.0 parts, molding may be ineffective.

Suitable inorganic fillers include silicas such as fused silica, crystalline silica and cristobalite, as well as alumina, silicon nitride, aluminum nitride, boron nitride, titanium oxide, glass fibers, alumina fibers, magnesium oxide, and zinc oxide. The filler is not particularly limited in shape and average particle size, and the shape and size are selected in accordance with the intended application. The average particle size is typically 1 to 50 µm, especially 4 to 25 µm. As used herein, the average particle size is a median diameter ($D_{50}$) as determined by a laser diffraction particle size distribution measuring system. The fillers may be used alone or in admixture.

The inorganic filler preferably has a chloride ion content of up to 10 ppm, more preferably up to 5 ppm and a sodium ion content of up to 10 ppm, more preferably up to 5 ppm, when impurities are extracted from the filler in a concentration of sample 5 g/water 50 g under conditions: 120° C. and 2.1 atm. As long as the impurity content is within the range, there is no risk that the semiconductor device encapsulated with the filled composition undergoes a decline of humidity resistance.

The inorganic filler is blended in an amount of preferably 150 to 1,500 parts by weight, more preferably 250 to 1,200 parts by weight per 100 parts by weight of the thermosetting resin component. Also preferably the inorganic filler accounts for 60 to 94% by weight, more preferably 65 to 92% by weight, even more preferably 70 to 90% by weight of the total weight of the resin composition.

Prior to use, the inorganic filler is preferably surface treated with coupling agents for enhancing the bond strength between the resin and the filler. Suitable coupling agents are silane coupling agents and titanate coupling agents. Preferred silane coupling agents include epoxy silanes such as γ-glycidoxypropyltrimethoxysilane, γ-glycidoxypropylmethyldiethoxysilane, β-(3,4-epoxycyclohexyl)ethyltrimethoxysilane; and aminosilanes such as N-(β-aminoethyl)-γ-aminopropyltrimethoxysilane, the reaction product of imidazole with γ-glycidoxypropyltrimethoxysilane, γ-aminopropyltriethoxysilane, N-phenyl-γ-aminopropyltrimethoxysilane. The amount of the coupling agent used and the surface treatment mode are not particularly limited and may accord with the standard technology. It is noted that the coupling agent used for the surface treatment of the filler is not encompassed in the tackifier.

The parting agent is not particularly limited and any well-known agents may be used. Exemplary are waxes including carnauba wax, rice wax, polyethylene, polyethylene oxide, montanic acid, ester compounds of montanic acid with saturated alcohols such as 2-(2-hydroxyethylamino) ethanol, ethylene glycol and glycerol, as well as stearic acid, stearic acid esters, stearic amide, ethylene bis(stearamide), and copolymers of ethylene and vinyl acetate. The parting agent may be used alone or in admixture.

The amount of the parting agent blended is preferably 0.5 to 5 parts by weight, more preferably 1 to 3 parts by weight per 100 parts by weight of components (A) and (B) combined. If the amount of parting agent is less than 0.5 part, the composition may be parted from the mold with difficulty. An amount in excess of 5 parts may be detrimental to outer appearance.

The flame retardant is not particularly limited and any well-known retardants may be used. Examples include phosphazene compounds, silicone compounds, zinc molybdate-carrying talc, zinc molybdate-carrying zinc oxide, aluminum hydroxide, magnesium hydroxide, molybdenum oxide, and antimony trioxide, which may be used alone or in admixture.

The amount of the flame retardant blended is preferably 2 to 20 parts by weight, more preferably 3 to 10 parts by weight per 100 parts by weight of components (A) and (B) combined. Less than 2 parts of the retardant may be ineffective whereas more than 20 parts of the retardant may adversely affect fluidity.

The ion trapping agent is not particularly limited and any well-known agents may be used. Examples include hydrotalcites, bismuth hydroxide and rare earth oxides, which may be used alone or in admixture.

The amount of the ion trapping agent blended is preferably 0.5 to 10 parts by weight, more preferably 1.5 to 5 parts by weight per 100 parts by weight of components (A) and (B) combined. Less than 0.5 part of the ion trapping agent may be ineffective for improving the electrical properties of encapsulated products whereas more than 10 parts of the agent may adversely affect fluidity.

The epoxy resin composition of the invention may be prepared by any desired methods. For example, the resin composition may be obtained by combining the epoxy resin, curing agent, benzotriazole derivative (A), aminoalkylsilane (B) and optional components in a predetermined compositional ratio, thoroughly mixing them on a mixer until uniform, melt mixing them on a hot roll mill, kneader or extruder, cooling the mixture for solidification, and grinding the solid to a suitable size. The resulting composition is ready for use as molding material.

Semiconductor Device

The epoxy resin composition is useful as an encapsulant for semiconductor devices including transistor, module, DIP, SO, flat pack and ball grid array type devices. The method for encapsulating a semiconductor device with the resin composition is not particularly limited. Any of prior art molding methods such as transfer molding, injection molding and casting may be used, with the transfer molding being preferred.

The epoxy resin composition is preferably molded or cured under suitable conditions, typically at 160 to 190° C. for 45 to 300 seconds and desirably post-cured at 170 to 250° C. for 2 to 16 hours.

The epoxy resin composition is improved in adhesion to copper substrates and silver-plated substrates. The semiconductor device encapsulated with the cured composition is improved in reflow resistance by virtue of the tight adhesion. The inventive composition is also improved in productivity because the same apparatus and conditions as used in the transfer molding of conventional epoxy resin compositions are applicable.

EXAMPLE

Examples of the invention are given below by way of illustration and not by way of limitation.

The components used in Examples are identified below.
Main Components
(A) Benzotriazole derivative:
  4-carboxybenzotriazole (CBT-1, Johoku Chemical Co., Ltd.)
(B) Aminoalkylsilane derivative:
  3-aminopropyltrimethoxysilane
  (KBM-903, Shin-Etsu Chemical Co., Ltd.)
Epoxy resin 1: cresol novolak type epoxy resin
  (Epiclon® N-665-EXP-S, epoxy equivalent 202 g/eq, DIC Corp.)
Epoxy resin 2: biphenyl aralkyl type epoxy resin
  (NC-3000, epoxy equivalent 273 g/eq, Nippon Kayaku Co., Ltd.)
Phenol curing agent 1: phenol novolak type phenol curing agent
  (Phenolite TD-2131, hydroxyl equivalent 104 g/eq, DIC Corp.)
Phenol curing agent 2: biphenyl aralkyl type phenol curing agent
  (MEH-7851, hydroxyl equivalent 203 g/eq, Meiwa Chemical Co., Ltd.)
Other Components
Inorganic filler: RS-8225H (average particle size 15 μm, Tatsumori Ltd.)
Cure promoter: 4-hydroxy-2-(triphenylphosphonium)phenolate
  (CAT-MBA, Shinryo Corp.)
Tackifier: 3-glycidoxypropyltrimethoxysilane
  (KBM-403, Shin-Etsu Chemical Co., Ltd.)
Parting agent: carnauba wax (TOWAX-131, Toa Chemical Co., Ltd.)
Premix of components (A) and (B):
  Premixes 1 to 3 were prepared by the following procedure and formulated in the amount shown in Table 1.
Premix 1
  A 1-L separable flask equipped with a stirrer, reflux condenser, dropping funnel and thermometer was charged with 81.6 g (0.5 mol) of 4-carboxybenzotriazole (CBT-1, Johoku Chemical Co., Ltd.) and 200 g of toluene and heated at 40° C. To the solution, 89.7 g (0.5 mol) of 3-aminopropyltrimethoxysilane (KBM-903, Shin-Etsu Chemical Co., Ltd.) was added dropwise. The solution was stirred at 30° C. for 1 hour, followed by filtration and drying. A white solid product was obtained. On $^1$H-NMR analysis, the product was identified to be 4-carboxybenzotriazole/3-aminopropyltrimethoxysilane salt.
Premix 2
  A 1-L separable flask equipped with a stirrer, reflux condenser, dropping funnel and thermometer was charged with 40.8 g (0.25 mol) of 4-carboxybenzotriazole (CBT-1, Johoku Chemical Co., Ltd.) and 200 g of toluene and heated at 40° C. To the solution, 89.7 g (0.5 mol) of 3-aminopropyltrimethoxysilane (KBM-903, Shin-Etsu Chemical Co., Ltd.) was added dropwise. The solution was stirred at 30° C. for 1 hour and then heated under reduced pressure at 150° C. for 1 hour to evaporate off toluene until the volatile content was below 2%. A syrup product was obtained.
Premix 3
  Premix 3 was prepared by the same procedure as Premix 2 except that 122.4 g (0.75 mol) of 4-carboxybenzotriazole was used.

A composition was prepared by blending the components in accordance with the formulation shown in Tables 1 and 2, melt mixing them on a hot two-roll mill until uniform, cooling and grinding. The composition was evaluated by the following tests. The results are also shown in Tables 1 and 2.

Adhesion Test
  On a copper alloy (Olin C7025) substrate of 15 mm×15 mm×0.15 mm thick, each of the compositions in Tables 1 and 2 was transfer molded under molding conditions: 175° C., 120 sec, and pressure 6.9 MPa, into a part of bottom area 10 mm$^2$ and height 3.5 mm. The molded part was post-cured at 180° C. for 4 hours. Using a die shear tester (DAGE), a shearing force was applied to the molded part (or specimen) at a shearing rate of 0.2 mm/s. The shear strength at which the part was peeled from the substrate surface was measured. Specimens were similarly prepared and tested using a nickel-plated substrate.

Reflow Resistance Test
  A silicon chip of 0.7 mm×0.7 mm×300 μm thick was mounted on a QFP 100 pin lead frame of copper alloy (C7025) using silver paste (Henkel AG). On this testing substrate, each of the compositions in Tables 1 and 2 was transfer molded (or encapsulated) under conditions: 175° C., 120 sec, and pressure 6.9 MPa. This was followed by post-curing at 180° C. for 4 hours, completing a specimen. After the specimen was kept at 85° C. and humidity 60% for 168 hours, it was tested by IR reflow treatment at 260° C. Using a ultrasonic flaw detector, it was observed whether or not the package was peeled. Ten specimens were tested, and the number of peeled specimens was counted.

TABLE 1

| Components (pbw) | Example | | | | | | | | |
| --- | --- | --- | --- | --- | --- | --- | --- | --- | --- |
|  | 1 | 2 | 3 | 4 | 5 | 6 | 7 | 8 | 9 |
| Epoxy resin 1 | 63 | 63 | 63 | 63 | 63 | 63 | 63 | 63 |  |
| Epoxy resin 2 |  |  |  |  |  |  |  |  | 57 |
| Phenol curing agent 1 | 37 | 37 | 37 | 37 | 37 | 37 | 37 | 37 |  |
| Phenol curing agent 2 |  |  |  |  |  |  |  |  | 43 |
| Inorganic filler | 400 | 400 | 400 | 400 | 400 | 400 | 400 | 400 | 400 |
| Cure promoter | 2.0 | 2.0 | 2.0 | 2.0 | 2.0 | 2.0 | 2.0 | 2.0 | 2.0 |

TABLE 1-continued

| Components (pbw) | Example | | | | | | | | |
|---|---|---|---|---|---|---|---|---|---|
| | 1 | 2 | 3 | 4 | 5 | 6 | 7 | 8 | 9 |
| (A) Benzotriazole | 0.70 | 0.50 | 0.86 | | | | 0.20 | 2.30 | 0.70 |
| (B) Aminoalkylsilane | 0.80 | 1.00 | 0.64 | | | | 0.30 | 2.70 | 0.80 |
| (A)(B) Premix 1 | | | | 1.50 | | | | | |
| (A)(B) Premix 2 | | | | | 1.50 | | | | |
| (A)(B) Premix 3 | | | | | | 1.50 | | | |
| (A)/(B) molar ratio | 0.96 | 0.55 | 1.48 | 1.00 | 0.50 | 1.50 | 0.73 | 0.94 | 0.96 |
| Tackifier | | | | | | | | | |
| Parting agent | 1.0 | 1.0 | 1.0 | 1.0 | 1.0 | 1.0 | 1.0 | 1.0 | 1.0 |
| Cu substrate adhesion (MPa) | 12 | 11 | 12 | 14 | 13 | 14 | 10 | 15 | 13 |
| Ni-plated substrate adhesion (MPa) | 6 | 5 | 5 | 6 | 5 | 5 | 4 | 6 | 6 |
| Reflow resistance (count) | 0/10 | 0/10 | 0/10 | 0/10 | 0/10 | 0/10 | 0/10 | 0/10 | 0/10 |

TABLE 2

| Components (pbw) | Comparative Example | | | | | | | |
|---|---|---|---|---|---|---|---|---|
| | 1 | 2 | 3 | 4 | 5 | 6 | 7 | 8 |
| Epoxy resin 1 | 63 | 63 | 63 | 63 | 63 | 63 | 63 | 63 |
| Epoxy resin 2 | | | | | | | | |
| Phenol curing agent 1 | 37 | 37 | 37 | 37 | 37 | 37 | 37 | 37 |
| Phenol curing agent 2 | | | | | | | | |
| Inorganic filler | 400 | 400 | 400 | 400 | 400 | 400 | 400 | 400 |
| Cure promoter | 2.0 | 2.0 | 2.0 | 2.0 | 2.0 | 2.0 | 2.0 | 2.0 |
| (A) Benzotriazole | | 1.50 | | 0.10 | 1.00 | 0.10 | 4.70 | |
| (B) Aminoalkylsilane | | | 1.50 | 1.40 | 0.50 | 0.10 | 5.30 | |
| (A)(B) Premix 1 | | | | | | | | |
| (A)(B) Premix 2 | | | | | | | | |
| (A)(B) Premix 3 | | | | | | | | |
| (A)/(B) molar ratio | | | | 0.08 | 2.20 | 1.10 | 0.97 | |
| Tackifier | | | | | | | | 1.5 |
| Parting agent | 1.0 | 1.0 | 1.0 | 1.0 | 1.0 | 1.0 | 1.0 | 1.0 |
| Cu substrate adhesion (MPa) | 5 | 6 | 6 | 7 | 6 | 7 | 15 | 6 |
| Ni-plated substrate adhesion (MPa) | unbonded | unbonded | 2 | 1 | 2 | unbonded | 6 | unbonded |
| Reflow resistance (count) | 8/10 | 9/10 | 8/10 | 7/10 | 4/10 | 5/10 | 10/10 | 6/10 |

As is evident from Comparative Examples 2 and 3 wherein the benzotriazole derivative or aminoalkylsilane derivative is separately blended, no significant improvement in bonding force is achieved. This indicates that the combined use of benzotriazole derivative and aminoalkylsilane derivative is important. Comparative Examples 4 and 5 wherein the (A)/(B) molar ratio is outside the range of 0.5 to 1.5 show that only a bonding force approximate to that of separate blending is obtained. Comparative Example 7 wherein the amounts of the benzotriazole derivative and aminoalkylsilane derivative are excessive shows a reduction of reflow resistance. This is because the aminoalkylsilane derivative generates an alcohol, which volatilizes during reflow, and the excessive addition amount leads to a reduction of reflow resistance.

It is believed from these results that the benzotriazole having high affinity to copper is arranged on the metal surface, and the interaction of the carboxylic acid portion in the benzotriazole with the aminoalkylsilane ensures tight adhesion.

Since the epoxy resin composition of the invention does not contain sulfur atoms, the risks of generation of sulfate ions and metal degradation by sulfide are eliminated. The composition has a high bonding force to metals like copper and nickel and exhibits good reflow resistance. The composition is thus advantageously applicable to semiconductor devices which expect the use of copper wires or copper substrates, and automobile-mounted devices which are disposed near the engine and exposed to high temperature, with the risk of sulfur-containing components being decomposed. In addition, since the composition is adhesive to nickel, nickel substrates, which are difficult to insure reliability unless they are usually coated with polyimide or the like, may be used as such, leading to a saving of steps. The composition is thus of great industrial worth.

Japanese Patent Application No. 2018-074419 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An epoxy resin composition for semiconductor encapsulation comprising an epoxy resin and a curing agent as essential components,
   the composition further comprising (A) a benzotriazole derivative having at least one carboxyl group per molecule and (B) an aminoalkylsilane derivative having at least one alkoxysilyl group per molecule in such amounts that the sum of (A) and (B) is 0.5 to 5.0 parts by weight per 100 parts by weight of the sum of the epoxy resin and the curing agent, and a molar ratio (A)/(B) ranges from 0.5/1 to 1.5/1.

2. The composition of claim 1 wherein the curing agent is a phenolic curing agent.

3. The composition of claim 1 wherein components (A) and (B) are present as a premix obtained by reacting components (A) and (B) in a molar ratio (A)/(B) of 0.5/1 to 1.5/1.

4. The composition of claim 1 wherein component (A) is a compound having the formula (1):

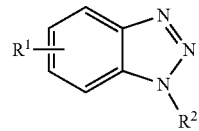

(1)

wherein $R^1$ is a $C_1$-$C_{10}$ straight alkyl group terminated with carboxyl or a $C_7$-$C_{20}$ aromatic hydrocarbon group terminated with carboxyl, and $R^2$ is hydrogen, a $C_1$-$C_{10}$ alkyl group, $C_1$-$C_{10}$ hydroxyl-containing hydrocarbon group, or $C_1$-$C_{10}$ hydrocarbon group terminated with carboxyl.

5. The composition of claim 1 wherein component (B) is a compound having the formula (2):

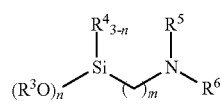

(2)

wherein $R^3$ is a $C_1$-$C_6$ alkyl group, $R^4$ is a $C_1$-$C_6$ alkyl group or $C_6$-$C_{10}$ aromatic hydrocarbon group, $R^5$ and $R^6$ are each independently hydrogen, $C_1$-$C_6$ alkyl group, $C_1$-$C_6$ amino-containing alkyl group, or $C_1$-$C_{10}$ aromatic hydrocarbon group, n is an integer of 1 to 3, and m is an integer of 1 to 6.

6. A semiconductor device encapsulated with a cured product of the epoxy resin composition of claim 1.

* * * * *